(12) United States Patent
Hall et al.

(10) Patent No.: US 6,756,839 B2
(45) Date of Patent: Jun. 29, 2004

(54) LOW VOLTAGE AMPLIFYING CIRCUIT

(75) Inventors: Jefferson W. Hall, Phoenix, AZ (US); Jade H. Alberkrack, Tempe, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/087,712

(22) Filed: Mar. 1, 2002

(65) Prior Publication Data

US 2003/0122595 A1 Jul. 3, 2003

Related U.S. Application Data

(63) Continuation-in-part of application No. 09/580,560, filed on May 30, 2000, now Pat. No. 6,380,769.

(51) Int. Cl.[7] .............................. G05F 1/10; G05F 3/02
(52) U.S. Cl. ........................ 327/538; 327/540; 327/541
(58) Field of Search ................................ 327/538, 540, 327/541–543, 427, 431, 434, 437, 435, 436, 108, 112, 560–563, 73, 430; 323/270, 280; 326/87; 330/86, 129

(56) References Cited

U.S. PATENT DOCUMENTS 5,168,175 A * 12/1992 Endo ........................... 327/430
5,570,061 A * 10/1996 Shimoda ...................... 327/538

* cited by examiner

*Primary Examiner*—Long Nguyen
(74) *Attorney, Agent, or Firm*—James J. Stipanuk

(57) ABSTRACT

An amplifier (170) includes first and second depletion mode transistors (161, 162) operating in response to first and second complementary signals ($V_{AMP+}$, $V_{AMP-}$), respectively, which route a first current ($I_{STACK1}$) from a first supply terminal (171) to an output (169) of the amplifier. Third and fourth depletion mode transistors (163, 164) receive the first and second complementary signals to route a second current ($I_{STACK2}$) from a second supply terminal (Ground) to the output. The first and second currents are summed to produce an output signal ($V_{AMP2}$).

5 Claims, 7 Drawing Sheets

Prior Art Linear Regulator

Linear Regulator

LOW VOLTAGE AMPLIFYING CIRCUIT

The present application is a continuation-in-part of prior U.S. application Ser. No. 09/580,560, filed on May 30, 2000 now U.S. Pat. No. 6,380,769, which is hereby incorporated by reference, and priority thereto for common subject matter is hereby claimed.

BACKGROUND OF THE INVENTION

The present invention relates in general to electronic circuits and, more particularly, to amplifying circuits that operate at low supply voltage levels.

As integrated circuits achieve higher levels of integration, there is a corresponding need to operate the circuits at reduced voltage levels in order to maintain power dissipation at manageable levels. For example, it is anticipated that future microprocessors and other digital circuits will need to operate with power supply voltages of 0.5 volts to maintain an acceptable die temperature. Future circuits are expected to operate with even lower supply voltages.

A low supply voltage typically is produced by a voltage regulator implemented as an integrated circuit. The regulator includes an error amplifier to sense the supply voltage and feed back an error signal that adjusts the voltage level to maintain regulation. The error amplifier and its associated circuitry preferably also operate at a low voltage in order to achieve a low power dissipation by the regulator circuit.

Most if not all integrated circuit amplifiers operate only at supply voltages that exceed the conduction threshold of the integrated circuit's transistors. When the supply voltage drops below the conduction threshold level, the transistors cease to function and gain of the amplifiers drops quickly to zero. In a case where the amplifier is being used in a voltage regulator, the rapid loss of gain can cause the regulator's output voltage to transition out of its specified range, which can damage both the regulator and the circuits operating from the regulator's output supply voltage.

Accordingly, there is a need for an amplifier circuit and method of amplifying that maintains functionality at lower supply voltages than what is currently available.

DETAILED DESCRIPTION OF THE PREFERED EMBODIMENT

Figure 1:
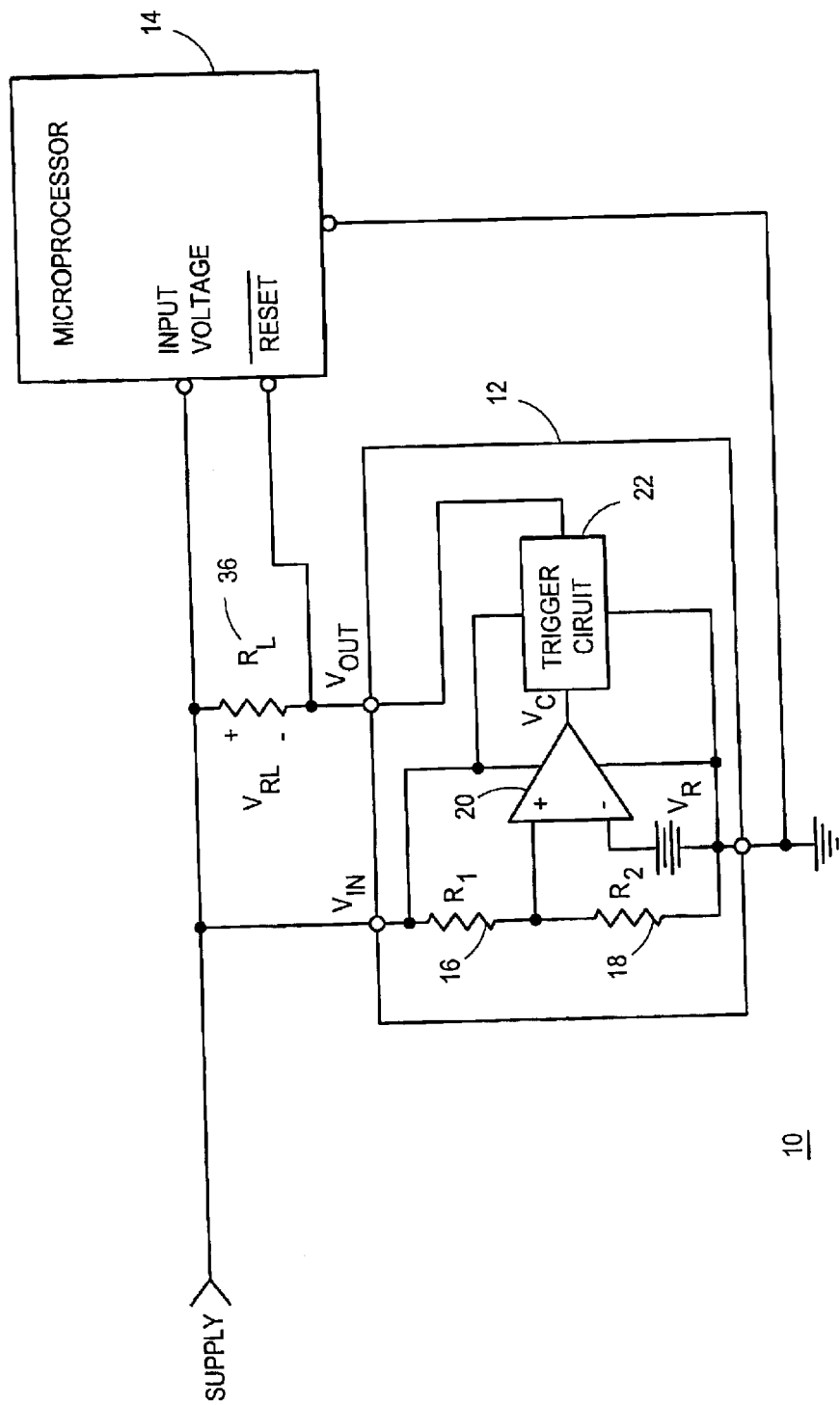
FIG. 1 is a block diagram of a supervisor circuit and microprocessor.

FIG. 1 illustrates one embodiment of system supervisor 10. Specifically, system supervisor 10 has supervisor circuit 12 to monitor a supply voltage line (Vsupply) of microprocessor 14. If Vsupply drops below the minimum operating voltage of microprocessor 14, e.g. reset voltage threshold, microprocessor 14 is shut down via a reset signal sent by supervisor circuit 12. Upon reset, microprocessor 14 stays in a fault mode until Vsupply increases above the reset voltage threshold for microprocessor 14.

In particular, Vsupply is monitored at the input voltage (Vin) of supervisor circuit 12. A voltage divider network receives the voltage at Vin and reduces the voltage by a ratio of resistor 16 and resistor 18. The reduced voltage is applied to the positive terminal of comparator 20. A reference voltage (Vref) is applied to the negative terminal of comparator 20. The reference voltage and resistor divider ratio are chosen based on the reset voltage threshold of microprocessor 14. If the voltage at the positive terminal of comparator 20 drops below Vref at the negative terminal of comparator 20, an output signal (Vc) is sent to trigger circuit 22. Upon receiving the signal from comparator 20, trigger circuit 22 turns on, driving current through RL which provides a reset signal to microprocessor 14. Once microprocessor 14 receives the reset signal it falls into a fault mode. Microprocessor 14 stays in the fault mode until Vsupply increases above the reset voltage threshold required for microprocessor 14 to operate in a normal mode.

Figure 2:
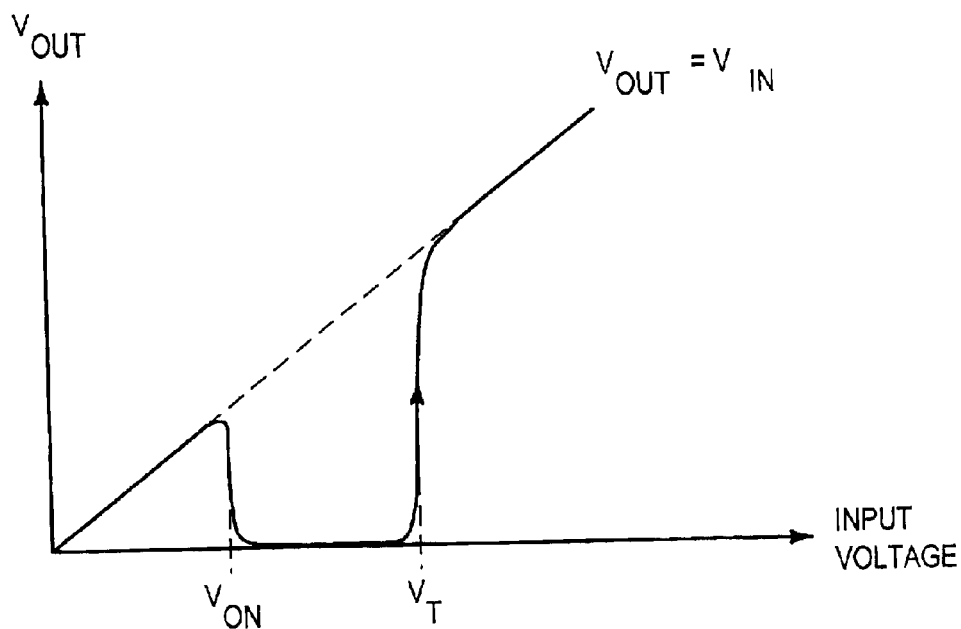
FIG. 2 is a waveform plot of an output signal of a prior art supervisor circuit.
Figure 3:
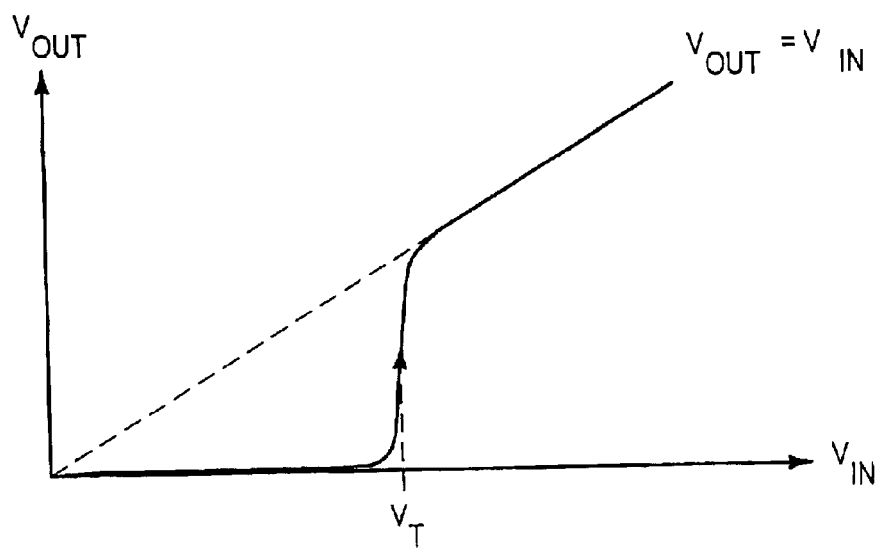
FIG. 3 is a waveform plot of an output signal of a supervisor circuit.

FIG. 2 illustrates a plot of the transfer function of output voltage versus input voltage of a prior art supervisor circuit. FIG. 3 illustrates a plot of the transfer function of output voltage versus input voltage of supervisor circuit 12. In the prior art, a major problem with supervisor circuits is that the output voltage follows the input voltage when the input voltage is below some voltage Von. As a result as illustrated in FIG. 2, a prior art supervisor circuit does not have a guaranteed output for an input voltage less than Von. Voltage level Von is representative of the voltage necessary to guarantee turn on of a trigger circuit of a prior art supervisor circuit.

The plot of the transfer function of output voltage versus input voltage of a supervisor circuit in FIG. 3 requires no minimum voltage to operate the trigger circuit. Thus, the supervisor circuit in FIG. 3 guarantees an output voltage for all input voltage levels to the supervisor circuit.

Figure 4:
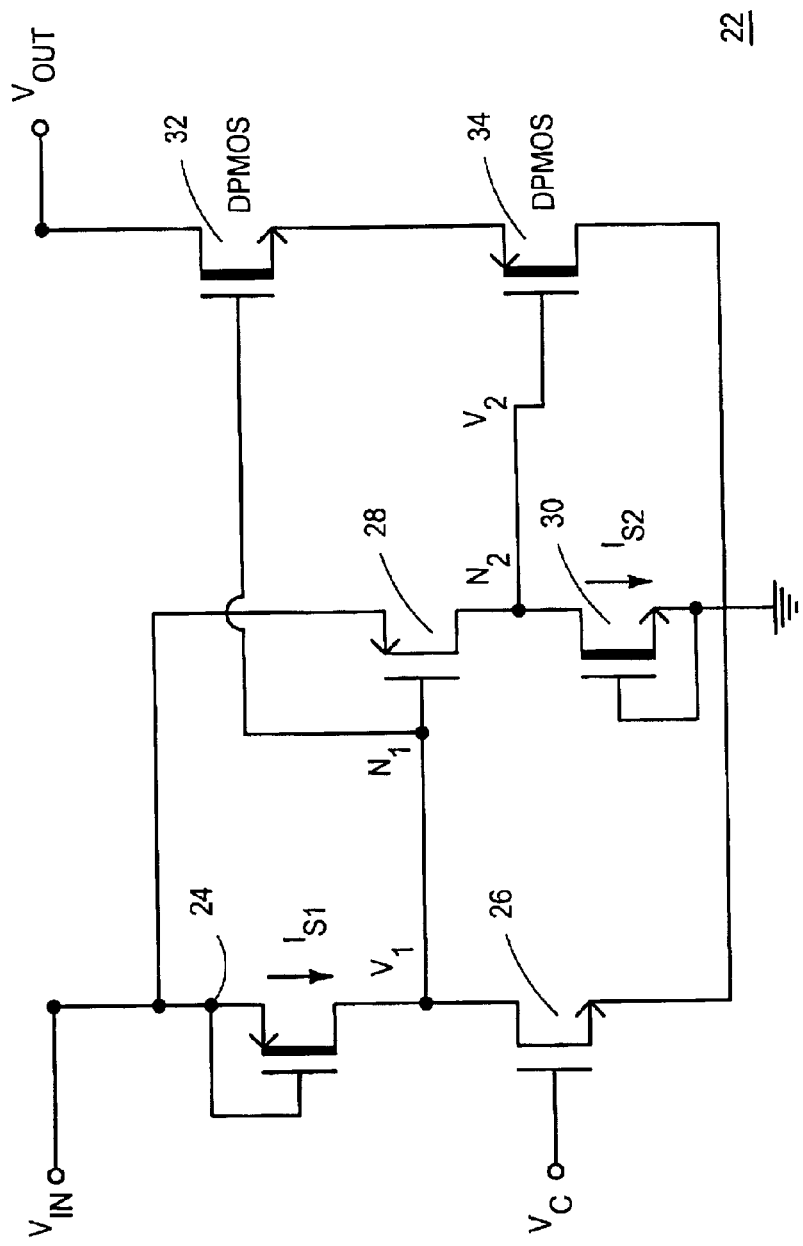
FIG. 4 is a schematic diagram of a trigger circuit of the supervisor circuit.

FIG. 4 illustrates trigger circuit 22 of supervisor circuit 12. Transistor 24 is a depletion mode transistor connected in a current source configuration to supply a small current $I_{s1}$. Transistor 24 has a source coupled to Vin to receive a voltage level, Vsupply, a gate connected to the source of transistor 24, and a drain to supply $I_{s1}$. Transistor 26 is an enhancement mode transistor, and receives a control signal (Vc) to switch transistor 26 on and off with the output of comparator 20. Transistor 26 has a drain coupled to the drain of transistor 24 to receive $I_{s1}$, a gate coupled to Vc from comparator 20, and a source coupled to ground. Transistor 28 is an enhancement mode transistor, and switches on and off in response to Vc. Transistor 28 has a source coupled to receive Vsupply at Vin, a gate coupled to the drain of transistor 26, and a drain coupled to the drain of transistor 30. Transistor 30 is a depletion mode transistor connected in a current sink configuration to supply small current $I_{s2}$. Transistor 30 has a drain coupled to the drain of transistor 28, a gate connected to the source of transistor 30, and a source coupled to ground. Transistor 32 is a depletion mode n-type transistor with a drain coupled to Vout of trigger circuit 22, and a gate coupled to the gate of transistor 28. Transistor 34 is a depletion mode p-type transistor with a source coupled to the source of transistor 32, a gate coupled to the drain of transistor 28, and a drain coupled to ground.

Trigger circuits used in the prior art typically consist of an inverter configuration with enhancement mode devices. FIG. 2 illustrates that a minimum voltage, Von, is required in the prior art to operate the enhancement mode devices used in trigger circuits. The trigger circuit of FIG. 4 uses the depletion mode transistor pair 32, 34 to eliminate the requirement for a minimum Von. In fact, using the depletion mode transistor pair 32, 34 in a trigger circuit provides down to a zero volt operation of a supervisor circuit.

In typical operation, trigger circuit 22 operates in one of two states. If Vsupply drops below the reset voltage threshold of microprocessor 14, the voltage at the positive terminal of comparator 20 drops below $V_R$ at the negative terminal of comparator 20 and the output of comparator 20 goes low. A low output at Vc turns off transistor 26 causing drive current $I_{s1}$ to charge the gate of depletion mode n-type transistor 32 pulling the gate voltage to Vsupply keeping transistor 32 on. Transistor 28 turns off, allowing current $I_{s2}$ to pull the gate of transistor 34 to ground keeping depletion mode p-type transistor 34 on. A current develops through load resistor 36 which creates a voltage drop $V_{RL}$ that is subtracted from Vsupply to provide a low output voltage at $V_{OUT}$ of supervisor circuit 12. A low output at $V_{OUT}$ of supervisor circuit 12 resets microprocessor 14 and puts microprocessor 14 in fault mode.

If Vsupply is above the reset voltage threshold of microprocessor 14, then the voltage at the positive terminal of comparator 20 is greater than Vref at the negative terminal of comparator 20 and the output of comparator 20 goes high. A high output at Vc turns on transistor 26 effectively driving current $I_{s1}$ and the gate of transistor 32 to ground, turning transistor 32 off. Transistor 28 turns on and drives current $I_{s2}$ from Vsupply to ground setting the voltage at the gate of depletion mode p-type transistor 34 to $V_{IN}$ which turns depletion mode p-type transistor 34 off. A high output at $V_{OUT}$ of supervisor circuit 12 removes the reset from microprocessor 14 and puts microprocessor 14 in normal mode.

Depletion mode n-type transistor 32 and depletion mode p-type transistor 34 are driven by separate and independent control signals. To operate both of the depletion mode devices independently requires that each gate thereof be driven by a separate source. Referring to FIG. 4, the gate of depletion mode n-type transistor 32 is driven by control signal Vc1 at node N1, and the gate of depletion mode p-type transistor 34 is driven by control signal Vc2 at node N2. Node N1 and N2 are separate and distinct sources supplying separate and distinct control signals. There is no necessary relationship between Vc1 and Vc2.

To reset microprocessor 14, both depletion mode transistors are switched on. To switch both depletion mode transistors on, depletion mode n-type transistor 32 is driven by $I_{s1}$ at node N1 to Vsupply and depletion mode p-type transistor 34 is driven by $I_{s2}$ at node N2 to ground. To remove the reset from microprocessor 14, both depletion mode transistors are switched off. To switch both depletion mode transistors off, transistor 26 is switched on driving $I_{s1}$ at node N1 to ground resulting in zero volts applied to the gate of depletion mode n-type transistor 32, and transistor 28 is switched on driving node N2 and the gate of depletion mode p-type transistor 34 to Vsupply.

Figure 5:
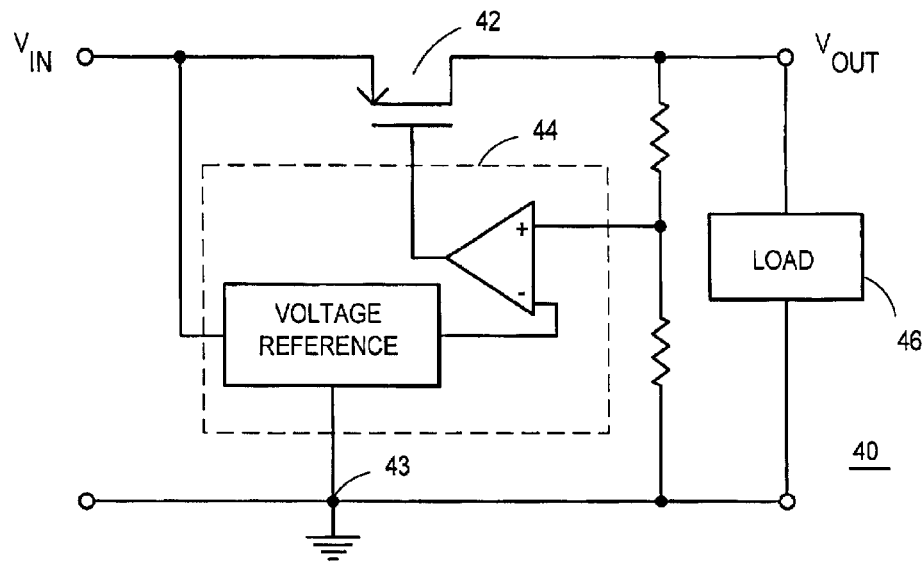
FIG. 5 is a block diagram of a prior art linear regulator circuit.

FIG. 5 illustrates prior art linear regulator 40 using enhancement mode p-type transistor 42. Linear regulator 40 takes in an unregulated input voltage at $V_{IN}$ and converts it to a regulated output voltage provided at $V_{OUT}$, and supplies a current at the regulated output voltage to load 46. Enhancement mode p-type transistor 42 has a gate voltage which is varied between $V_{IN}$ and ground potential 43 by controller 44. During operation, when prior art enhancement mode p-type transistor 42 is turned off by controller 44, a leakage current develops through enhancement mode p-type transistor 42. Typically, to reduce the leakage current, a larger threshold voltage for enhancement mode p-type transistor 42 is chosen to reduce the leakage current created at a zero gate to source voltage. However, the prior art poses the problem that as the threshold voltage is increased to compensate for the leakage current, $V_{IN}$ must be at least the threshold voltage of enhancement mode p-type transistor 42 to turn linear regulator 40 on.

FIG. 4 illustrated an application using two depletion mode transistors, one n-type transistor and one p-type transistor with both transistors connected in series. The two depletion mode transistors have separate and distinct control signals applied to the gates thereof in a digital manner by a controller. In another application, two depletion mode transistors are controlled using separate and distinct control signals in an analog manner as explained forthcoming.

Figure 6:
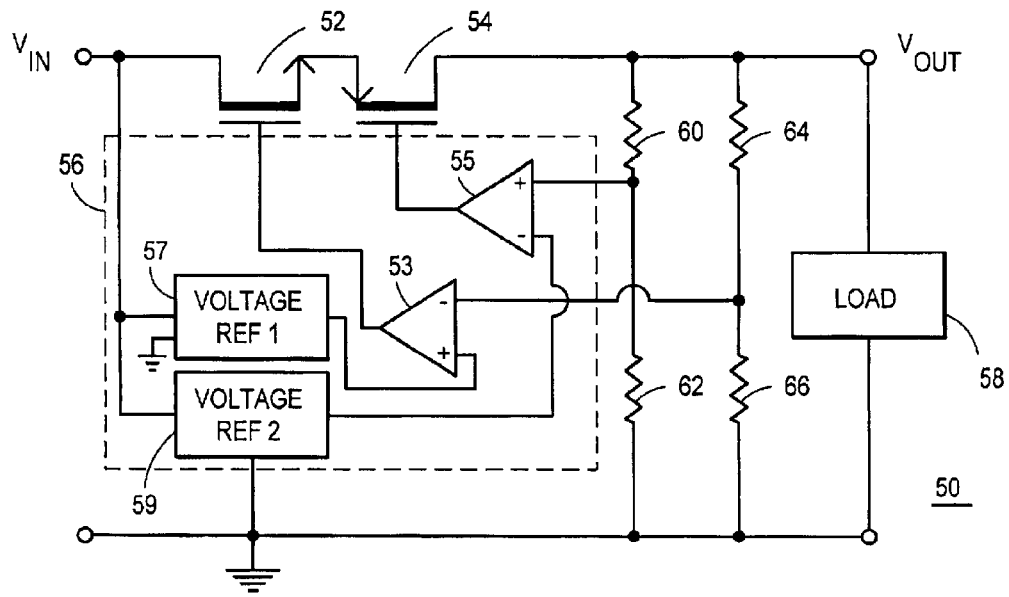
FIG. 6 is a block diagram of a first regulator circuit.

FIG. 6 illustrates linear regulator 50 using depletion mode transistor pair 52, 54 connected in series. Depletion mode transistor 52 is an n-type depletion mode transistor, and depletion mode transistor 54 is a p-type depletion mode transistor. Linear regulator 50 takes in an unregulated input voltage at VIN and converts it to a regulated output voltage provided at $V_{OUT}$, and supplies a current at the regulated output voltage to load 58. Controller 56 provides separate and independently controlled signals to the gates of each transistor thereof in an analog manner.

An n-type transistor by its physical characteristics typically has a lower current leakage than a p-type transistor. Using n-type depletion mode transistor 52 at the input, Vin, of linear regulator 50 controls leakage current thereof. Also, depletion mode transistors by their inherent characteristic have a negative voltage threshold and as a result can operate at very low voltages. Linear regulator 50 uses the aforementioned characteristics of depletion mode transistors to provide regulation between $V_{IN}$ and $V_{OUT}$ at a low operating voltage without compromising leakage current.

Controller 56 provides continuous analog voltages, between zero volts and $V_{IN}$, to the gates of depletion mode transistor 52, and depletion mode transistor 54 to modulate the voltage at load 58, based on current at load 58. Depletion mode transistor 52, and depletion mode transistor 54 are driven by separate and independent control signals at the gates thereof by controller 56 to provide the load current necessary to regulate $V_{OUT}$. To operate both of the depletion mode devices independently requires that each gate thereof be driven by a separate source. Referring to FIG. 6, the gate of depletion mode n-type transistor 52 is driven by control signal Vc3, and the gate of depletion mode p-type transistor 54 is driven by control signal Vc4. Control signals Vc3 and Vc4 are separate and distinct sources supplying separate and distinct control signals. There is no necessary relationship between Vc3 and Vc4.

Controller 56 includes amplifier 53 having a negative terminal connected between resistor 66 and resistor 64, a positive terminal connected to voltage reference 57, and an output connected to the gate of depletion mode transistor 52. Amplifier 55 has a positive terminal connected between resistor 60 and resistor 62, a negative terminal connected to a second voltage reference 59, and an output connected to the gate of depletion mode transistor 54. Resistors 60, 62, 64, and resistor 66 provide the necessary feedback information for controller 56.

In summary, a trigger circuit with the operation shown in FIG. 3 is illustrated to provide a guaranteed output for all input voltages down to zero volts. The trigger circuit is used within a supervisor circuit to monitor a microprocessor even if the operating voltage to the supervisor circuit drops to zero volts. In typical operation, if the operating voltage to a microprocessor drops below the reset voltage threshold of the microprocessor, which may be close to zero volts, the trigger circuit provides a reset signal to the microprocessor. When the operating voltage increases above the reset voltage threshold the trigger circuit removes the reset signal to the microprocessor. The trigger circuit consist of a depletion mode n-type and p-type transistor pair with their gates thereof driven by separate sources. The depletion mode n-type and p-type transistor pair are driven by separate sources to operate the transistor pair thereof out of phase to provide a logic function down to zero volts where the present art fails.

Furthermore, a linear regulator is shown in FIG. 6 with a depletion mode n-type and p-type transistor pair with their gates thereof driven by separate and distinct sources to provide a low voltage operation with minimal current leakage. The embodiment of FIG. 6 provides linear regulation for low voltage applications without compromise of leakage current. Having the n-type depletion mode transistor connected to $V_{IN}$ further provides a low leakage current operation.

In the following figures, elements having the same reference numbers have similar functionality.

Figure 7:
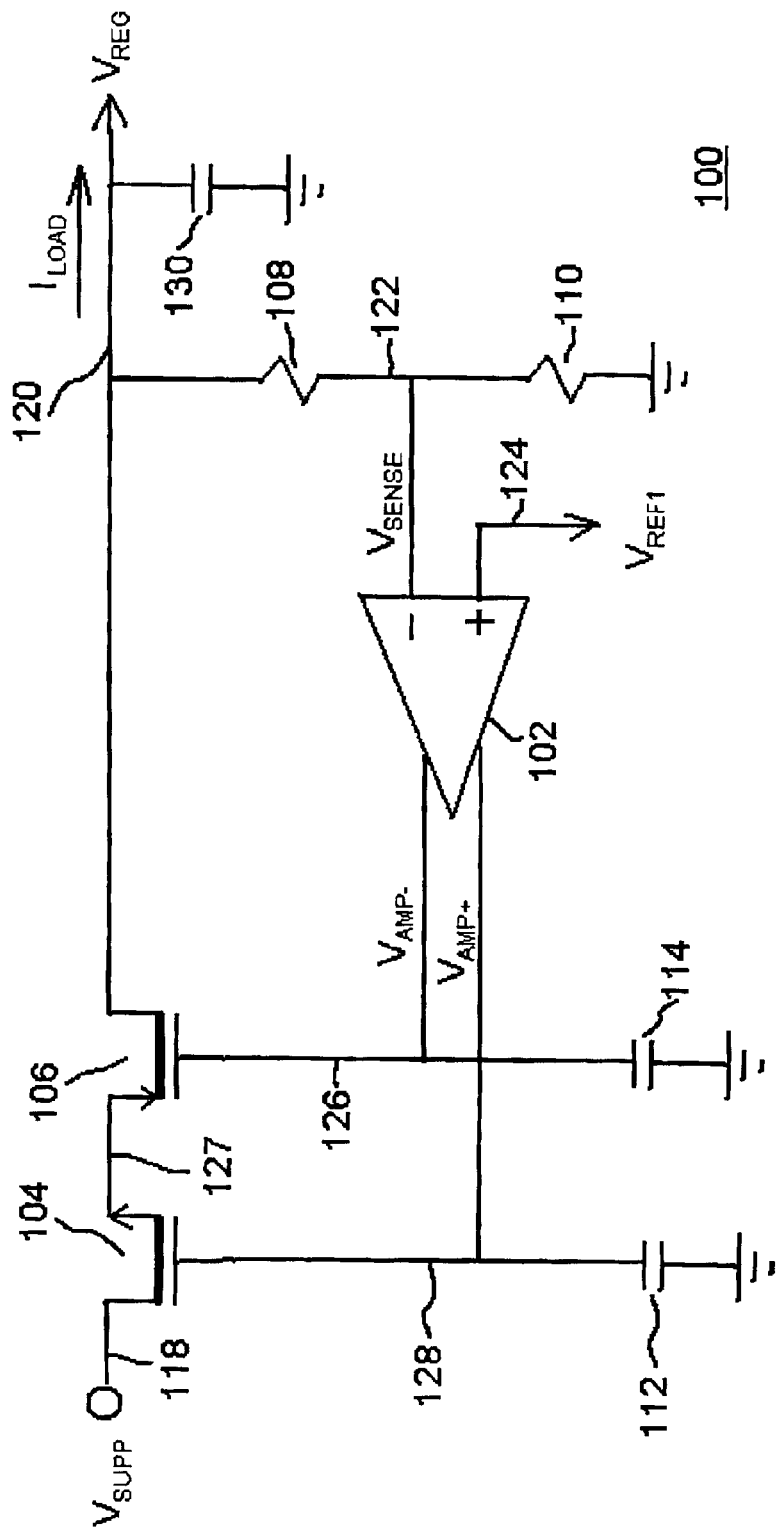
FIG. 7 is a schematic diagram of a second regulator circuit including an amplifier.

FIG. 7 is a schematic diagram of a voltage regulator 100, including an amplifier 102, transistors 104 and 106, resistors 108 and 110 and capacitors 112 and 114. Voltage regulator 100 receives an input supply voltage $V_{SUPP}$ on a supply terminal coupled to a node 118 and produces a regulated voltage $V_{REG}$ at an output 120. Regulator 100 is suitable for integrating on a semiconductor die to form an integrated voltage regulator circuit.

Resistors 108 and 110 are scaled to a predetermined ratio and serially coupled between output 120 and ground potential to function as a voltage divider that monitors or senses regulated voltage $V_{REG}$ and provides a divided sense voltage $V_{SENSE}$ on a node 122.

Amplifier 102 comprises a differential input-differential output voltage or transconductance amplifier configured to operate from supply voltage $V_{SUPP}$ at values approaching zero volts. In one embodiment, $V_{SUPP}$=0.3 volts. An inverting input is coupled to node 122 to receive sense voltage $V_{SENSE}$ and a non-inverting input at a node 124 receives a reference voltage $V_{REF1}$. An error voltage $V_{ERR}=(V_{REF1}-V_{SENSE})$ applied across the inverting and non-inverting inputs is amplified to produce a differential output signal $V_{AMP}=(V_{AMP+}-V_{AMP-})$ across output nodes 128 and 126, where $V_{AMP-}$ and $V_{AMP+}$ are the component signals of $V_{AMP}$ and have opposing phases.

The transient characteristics of amplifier 102 are a function of the impedances of nodes 126 and 128, which are determined by loop stabilization capacitors 112 and 114 and the gate capacitances of transistors 104 and 106, and therefore are highly capacitive. Accordingly, the output stage of amplifier 102 is configured to drive nodes 126 and 128 with currents high enough to meet specified transient response characteristics and low enough to ensure loop stability under the specified operating and environmental conditions of regulator 100.

Transistors 104 and 106 are formed as metal oxide semiconductor field effect transistors (MOSFET) operating in the depletion mode. Transistor 104 is an n-channel MOSFET while transistor 106 is a p-channel MOSFET as shown in FIG. 7. Transistors 104 and 106 are serially coupled between input 120 and output 118, with their sources being commonly coupled to a node 127 to function as a pass element of regulator 100. Because transistors 104 and 106 are formed as series coupled depletion mode devices, their conduction thresholds are negative, so they are conductive even with zero volts of gate to source bias potential. As a result, regulator 100 is able to maintain regulation when the input-output voltage differential $(V_{SUPP}-V_{REG})$ approaches zero volts. In one embodiment, input-output voltage differential $(V_{SUPP}-V_{REG})$ is 0.2 volts. In one embodiment, transistors 104 and 106 are formed to have typical conduction thresholds of −0.2 volts, thereby providing conduction at zero volts of gate to source potential.

In operation, assume that $V_{SUPP}$=0.3 volts, $V_{REF1}$=0.125 volts and $V_{REG}$ initially is zero, with a target value of 0.25 volts. Further assume that the resistances of resistors 108 and 110 are equal, so $V_{SENSE}=V_{REG}/2$. Since $V_{REG}$ is zero, $V_{SENSE}$ is zero as well, and therefore less than $V_{REF1}$, so $V_{AMP-}$ decreases while $V_{AMP+}$ increases, turning on transistors 104 and 106 to couple a current $I_{LOAD}$ from input 118 to output 120 to charge an external load capacitor 130 to increase the value of $V_{REG}$. $I_{LOAD}$ continues to flow until $V_{REG}$ reaches its target value of 0.25 volts, at which time $V_{SENSE}=V_{REF1}$=0.125 volts, approximately. While $V_{REG}$ is at its target value, amplifier 102 controls the conduction of transistors 104 and 106 such that $I_{LOAD}$ flows at a level sufficient to supply the current requirements of the load circuitry (not shown) operating from $V_{REG}$, thereby maintaining regulation. In one embodiment, regulator 100 is configured to supply $I_{LOAD}$ to a magnitude of one hundred milliamperes.

Under normal conditions $V_{REG}$ does not exceed its target value, but load switching or system noise may result in momentarily increasing $V_{REG}$ to a value greater than the 0.25 volt target value. If that occurs, amplifier 102 produces values of $V_{AMP+}$ and $V_{AMP-}$ that reduce the conduction of transistors 104 and 106 to allow the flow of current to the load circuitry to be supplied from charge stored on capacitor 130 until $V_{REG}$ decays to its target value.

Figure 8:
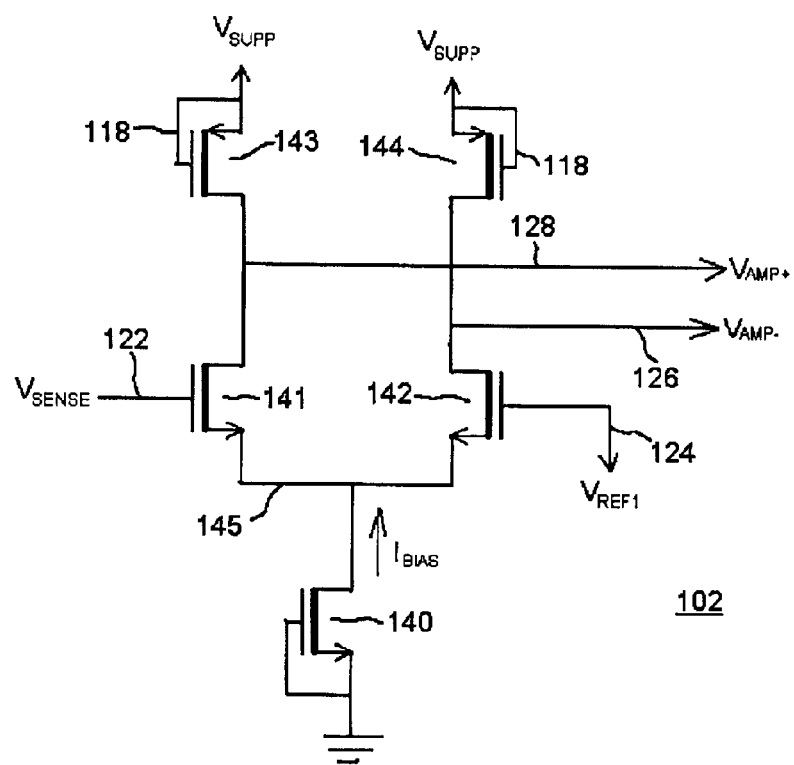
FIG. 8 is a schematic diagram of the amplifier.

FIG. 8 shows a schematic diagram of amplifier 102 in further detail, including depletion mode MOSFETs 140–144.

Transistor 140 is an n-channel device whose gate and source operate at ground potential to function as a current source that supplies a bias current $I_{BIAS}$ to a common node 145. Transistors 143–144 are p-channel devices whose sources and gates are coupled to node 118 to function as current sources or high impedance loads that provide amplifier 102 with a high open loop gain. Alternatively, high impedance resistors or other types of devices can be used to perform functions equivalent to those performed by transistors 140 and 143–144. However, such alternative devices have the disadvantage of consuming a larger area of a semiconductor die, and therefore have a higher cost, than transistors 140 and 143–144.

Transistors 141–142 are configured as a differential pair receiving $V_{SENSE}$ and $V_{REF1}$ as a differential input signal that routes $I_{BIAS}$ through transistors 143 and 144 to produce component differential signals $V_{AMP+}$ and $V_{AMP-}$ of differential output signal $V_{AMP}$. Nodes 126 and 128 are relatively high impedance nodes which allow amplifier 102 to be easily compensated by capacitors 112 and 114 (shown in FIG. 7) when operated in a closed loop condition such as that of regulator 100.

The use of depletion mode devices for transistors 140–144 maintains their conduction and allows amplifier 102 to function at values of supply voltage $V_{SUPP}$ that approach zero. Accordingly, amplifier 102 is well suited for low voltage applications such as in regulating the supply voltage of a low voltage microprocessor. Although amplifier 102 is shown and described as being used as an active component of voltage regulator 100, it is evident that amplifier 102 is suitable for use in virtually any other analog application that would benefit from its economical structure and low voltage operation.

Figure 9:
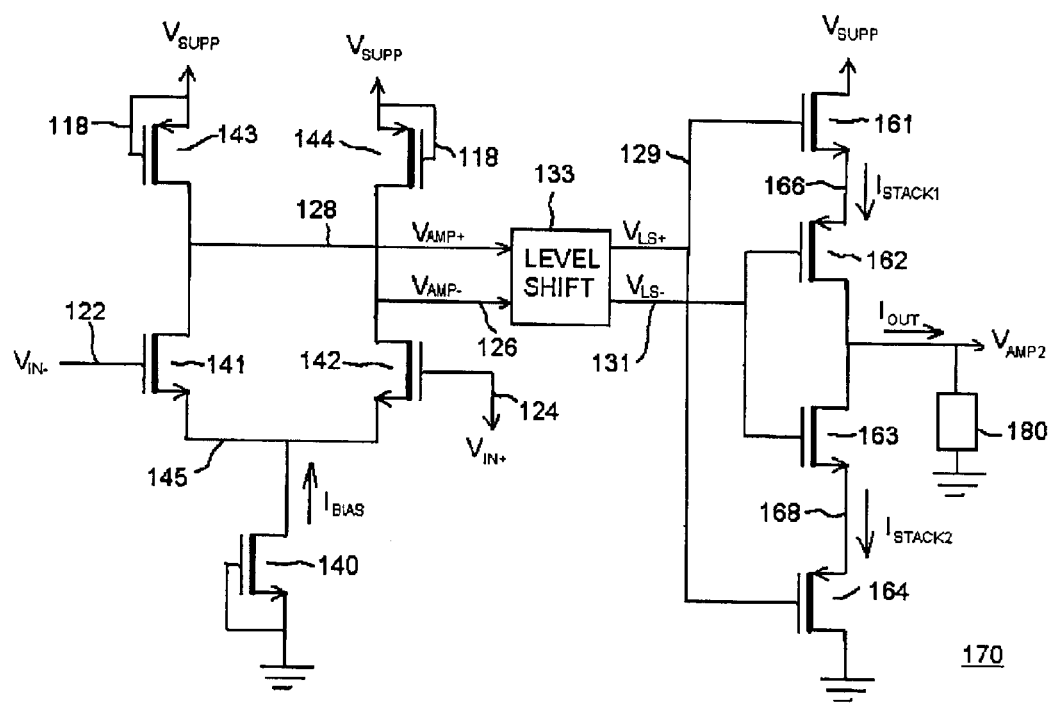
FIG. 9 is a schematic diagram of an alternate embodiment of the amplifier.

FIG. 9 shows a schematic diagram of an amplifier 170 receiving oppositely phased differential input signals $V_{IN+}$ and $V_{IN-}$ and producing a single ended amplified output signal $V_{AMP2}$ at an output 169. Amplifier 170 is coupled to a supply terminal 118 to operate from a supply voltage $V_{SUPP}$. Amplifier 170 includes depletion mode MOSFET transistors 140–144 and 161–164 and a level shift circuit 133, and is suitable for use as a low voltage amplifier in an analog amplification application such as an error amplifier in a voltage regulator. In an alternate embodiment, amplifier 170 is configured with a high transconductance or voltage gain for use as a comparator.

Transistors 140–144 function as a first or input stage of amplifier 170 and operate in a fashion similar to that described in the description of FIG. 8. Consequently, the first stage has the benefit of operating at values of $V_{SUPP}$ that approach zero.

Level shifter 133 level shifts component differential signals $V_{AMP+}$ and $V_{AMP-}$ to produce level shifted signals $V_{LS+}$ and $V_{LS-}$ on node 131 and 129, respectively. $V_{LS+}$ and $V_{LS-}$ retain the information contained in $V_{AMP+}$ and $V_{AMP-}$ but are level shifted by a DC voltage in order to bias transistors 161–164 for the desired operation. For example, if class A operation is desired, the level shifting DC voltage may be set to one-half the value of supply voltage $V_{SUPP}$. Other level shifting voltages may be used to provide other classes of operation.

Transistors 161–164 function as a second or output stage of amplifier 170 whose operation is described as follows. Transistor 161 is an n-channel device controlled by component signal $V_{LS-}$ to set the conduction between supply terminal 118 and a node 166. Transistor 162 is a p-channel device controlled by component signal $V_{LS+}$ to set the conduction between node 166 and output 169. The conduction of transistors 161–162 determine the level of a current $I_{STACK1}$ that is routed from supply terminal 118 to output 169 as a first component of output signal $V_{AMP2}$.

Transistor 164 is a p-channel device controlled by component signal $V_{LS-}$ to set the conduction between ground potential and a node 168. Transistor 163 is an n-channel device controlled by component signal $V_{AMP+}$ to set the conduction between node 168 and output 169. The conduction of transistors 163–164 determines the level of a current $I_{STACK2}$ that is routed from ground to output 169 as a second component of output signal $V_{AMP2}$.

Output voltage $V_{AMP2}$ is developed from an output current $I_{OUT}$ that flows from output 169 to a load 180 as the difference between currents $I_{STACK1}$ and $I_{STACK2}$.

It can be seen that the present invention provides an amplifier that occupies a small die area and has a low cost while operating with an input-output voltage differential approaching zero volts. First and second depletion mode transistors operate in response to first and second signals, respectively, to route a first current from a first supply terminal to an output of the amplifier. Third and fourth depletion mode transistors operate in response to the first and second signals to route a second current from a second supply terminal to the output. The first and second currents are summed to develop an output signal at the output. The negative thresholds inherent in depletion mode transistors ensures active functionality with zero volts gate to source potential, which allows the amplifier to function at very low supply voltages, even approaching zero volts. The first or second signal can be coupled to a reference voltage to operate the amplifier as a voltage regulator.

What is claimed is:

1. An amplifier, comprising:

a gain stage having an input for receiving an input signal and first and second outputs for providing a differential amplified signal; and an output stage including first and second depletion mode transistors operating in response to the differential amplified signal and serially coupled between a supply terminal and an output of the amplifier for providing an output signal, wherein the first depletion mode transistor is an n-channel device having a drain coupled to the supply terminal and a source coupled to a node, and the second depletion mode transistor is a p-channel device having a source coupled to the node and a drain coupled to the output of the amplifier.

2. The amplifier of claim 1, further comprising a feedback path from the output of the amplifier to the input of the gain stage to reduce the gain of the amplifier.

3. The amplifier of claim 2, wherein the feedback path includes:

a first resistor coupled between the output of the amplifier and the input of the gain stage; and a second resistor coupled from the input of the gain stage to a reference node.

4. The amplifier of claim 3 for functioning as a voltage regulator, also including a reference voltage applied to another input of the gain stage to maintain the output signal at a constant potential.

5. The amplifier of claim 4, wherein a difference between a supply voltage at the supply terminal and the constant potential of the output signal is less than 0.2 volts.

* * * * *